(12) United States Patent
Lin

(10) Patent No.: US 9,196,754 B2
(45) Date of Patent: *Nov. 24, 2015

(54) CHIP PACKAGE AND FABRICATION METHOD THEREOF

(71) Applicant: XINTEC INC., Jhongli, Taoyuan County (TW)

(72) Inventor: Chia-Sheng Lin, Zhongli (TW)

(73) Assignee: XINTEC INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/516,492

(22) Filed: Oct. 16, 2014

(65) Prior Publication Data

US 2015/0035143 A1    Feb. 5, 2015

Related U.S. Application Data

(63) Continuation of application No. 13/369,085, filed on Feb. 8, 2012, now Pat. No. 8,901,701.

(60) Provisional application No. 61/441,507, filed on Feb. 10, 2011.

(51) Int. Cl.

| H01L 21/70 | (2006.01) |
|---|---|
| H01L 31/02 | (2006.01) |
| H01L 21/768 | (2006.01) |
| H01L 23/31 | (2006.01) |

(Continued)

(52) U.S. Cl.
CPC .... *H01L 31/02005* (2013.01); *H01L 21/76898* (2013.01); *H01L 23/3114* (2013.01); *H01L 23/481* (2013.01); *H01L 23/525* (2013.01); *H01L 27/14618* (2013.01); *H01L 27/14627* (2013.01); *H01L 27/14685* (2013.01); *H01L 31/02327* (2013.01); *H01L 31/1876* (2013.01); *H01L 33/58* (2013.01); *H01L 33/62* (2013.01); *H01L 24/13* (2013.01); *H01L 2224/02372* (2013.01); *H01L 2224/0401* (2013.01); *H01L 2224/05548* (2013.01); *H01L 2224/13022* (2013.01); *H01L 2224/13024* (2013.01); *H01L 2924/0001* (2013.01); *H01L 2924/1461* (2013.01); *H01L 2933/0058* (2013.01); *H01L 2933/0066* (2013.01)

(58) Field of Classification Search
CPC ................... H01L 21/768; H01L 21/76898
USPC ........... 257/522, 774; 438/411, 421, 640, 701
See application file for complete search history.

(56) References Cited

U.S. PATENT DOCUMENTS

| 7,667,335 B2* | 2/2010 | Lin et al. .................. 257/779 |
| 8,084,854 B2* | 12/2011 | Pratt et al. ................ 257/698 |

(Continued)

*Primary Examiner* — Nicholas Tobergte
(74) *Attorney, Agent, or Firm* — Liu & Liu

(57) ABSTRACT

A chip package is disclosed. The package includes a semiconductor chip having a first surface and a second surface opposite thereto, at least one conductive pad adjacent to the first surface, and an opening extending toward the first surface from the second surface to expose the conductive pad. The caliber adjacent to the first surface is greater than that of the opening adjacent to the second surface. An insulating layer and a redistribution layer (RDL) are successively disposed on the second surface and extend to a sidewall and a bottom of the opening, in which the RDL is electrically connected to the conductive pad through the opening. A passivation layer covers the RDL and partially fills the opening to form a void between the passivation layer and the conductive pad in the opening. A fabrication method of the chip package is also disclosed.

24 Claims, 9 Drawing Sheets

(51) Int. Cl.
*H01L 23/48* (2006.01)
*H01L 23/525* (2006.01)
*H01L 27/146* (2006.01)
*H01L 31/0232* (2014.01)
*H01L 31/18* (2006.01)
*H01L 33/58* (2010.01)
*H01L 33/62* (2010.01)
*H01L 23/00* (2006.01)

(56) References Cited

U.S. PATENT DOCUMENTS

2008/0185738 A1* 8/2008 Chung et al. .................. 257/782
2010/0038778 A1* 2/2010 Lee et al. ...................... 257/737

* cited by examiner

CHIP PACKAGE AND FABRICATION METHOD THEREOF

CROSS REFERENCE TO RELATED APPLICATIONS

This application is a Continuation of U.S. application Ser. No. 13/369,085, filed on Feb. 8, 2012, which claims the benefit of U.S. Provisional Application No. 61/441,507, filed Feb. 10, 2011, the entirety of which is incorporated by reference herein.

BACKGROUND OF THE INVENTION

1. Field of the Invention

The invention relates to a chip package and more particularly to a chip package with a through substrate via (TSV) structure having a void therein and a fabrication method thereof.

2. Description of the Related Art

As demand for electronic or optoelectronic products, such as digital cameras, camera phones, bar code readers, and monitors, increase, semiconductor technology for products made therefrom must develop rapidly, as product trends demand the semiconductor chip size to be miniaturized and functionality of the semiconductor chip to be increased and become more complex.

Therefore, more than one semiconductor chip is typically placed in a sealed package, due to performance demands, for operational stability. However, since there is mismatch of the coefficient of thermal expansion (CTE) between a passivation layer and a metal redistribution layer (RDL) in a chip package, the metal RDL easily peels off from conductive pads of the semiconductor chip, thus, reducing the reliability of the chip package.

Accordingly, there is a need to develop a novel package structure capable of mitigating or eliminating the above problems.

BRIEF SUMMARY OF THE INVENTION

An embodiment of a chip package comprises a semiconductor chip having a first surface and a second surface opposite thereto, at least one conductive pad adjacent to the first surface, and a first opening extending toward the first surface from the second surface to expose the conductive pad. The first opening has a first caliber adjacent to the first surface and a second caliber adjacent to the second surface, and the first caliber is greater than the second caliber. An insulating layer is disposed on the second surface, and extends to a sidewall and a bottom of the first opening, and exposes the conductive pad. A redistribution layer is disposed on the insulating layer and is electrically connected to the exposed conductive pad through the first opening. A passivation layer covers the redistribution layer and partially fills the first opening to form a void between the passivation layer and the conductive pad in the first opening. The passivation layer has at least one second opening exposing the redistribution layer above the second surface. A conductive bump is disposed in the second opening and is electrically connected to the redistribution layer through the second opening.

A method for fabricating a chip package comprises providing a semiconductor wafer having a first surface and a second surface opposite thereto and having at least one conductive pad adjacent to the first surface and corresponding to each chip region. The semiconductor wafer is etched to form a first opening extending toward the first surface from the second surface in each chip region to expose the conductive pad, wherein the first opening has a first caliber adjacent to the first surface and a second caliber adjacent to the second surface, and the first caliber is greater than the second caliber. An insulating layer is formed on the second surface, and extends to a sidewall and a bottom of each first opening and exposes the conductive pad. A redistribution layer is formed on the insulating layer, wherein the redistribution layer is electrically connected to the exposed conductive pad through each first opening. The redistribution layer is covered and each first opening is partially filled with a passivation layer to form an avoid between the passivation layer and the conductive pad in each first opening, wherein the passivation layer has at least one second opening exposing the redistribution layer above the second surface. A conductive bump is formed in the second opening, wherein the conductive bump is electrically connected to the redistribution layer through the second opening. The semiconductor wafer is cut to form a semiconductor chip corresponding to each chip region.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
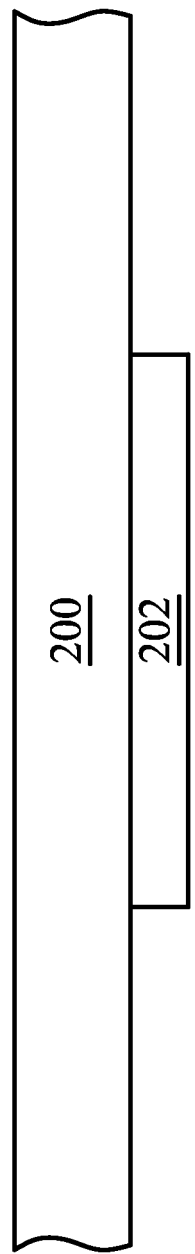
FIGS. 1A to 1I are cross sections of an exemplary embodiment of a method for fabricating a chip package according to the invention.

The following description encompasses the fabrication and the purpose of the invention. It can be understood that this description is provided for the purpose of illustrating the fabrication and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Figure 1B:
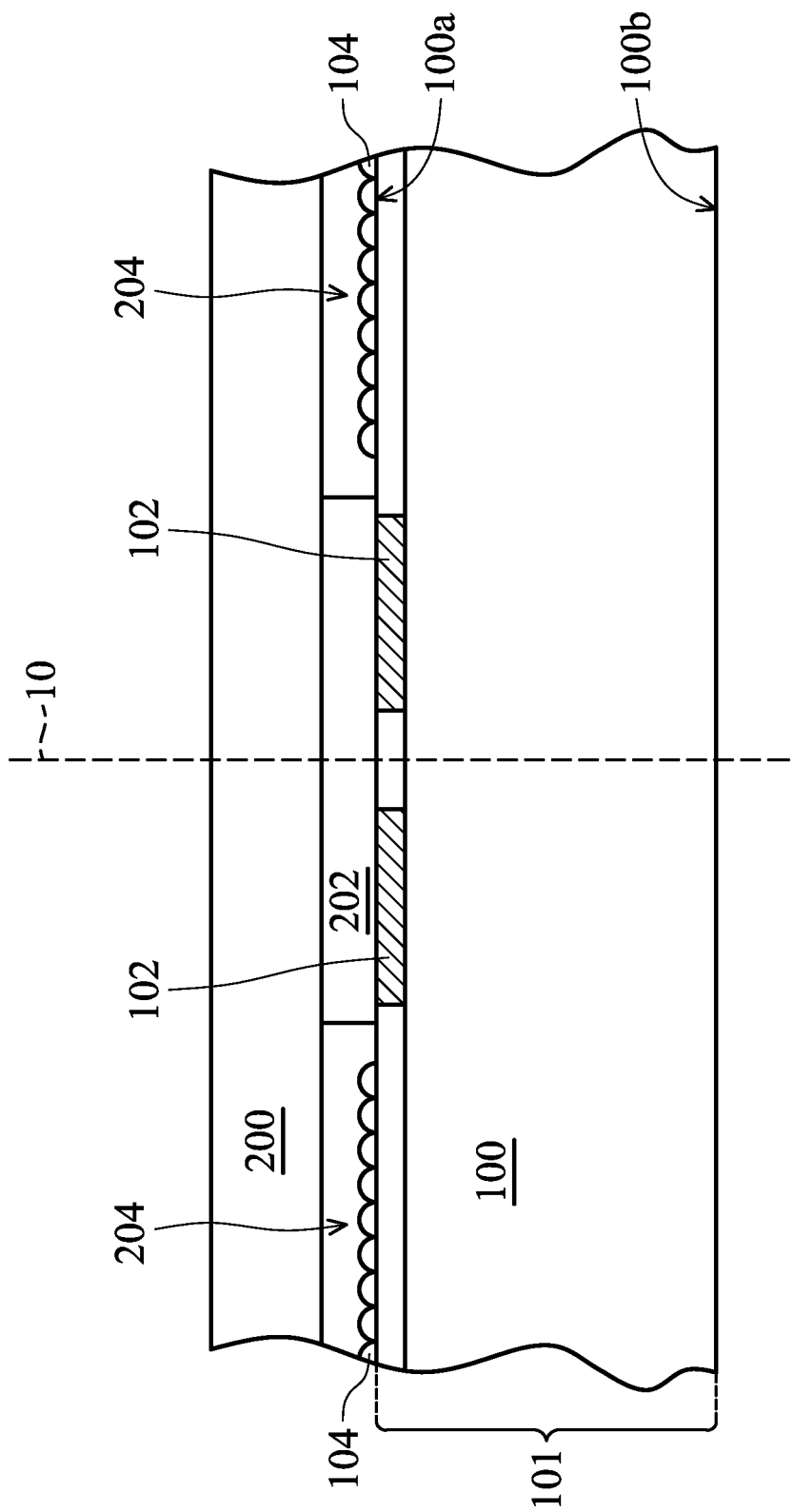
Figure 1C:
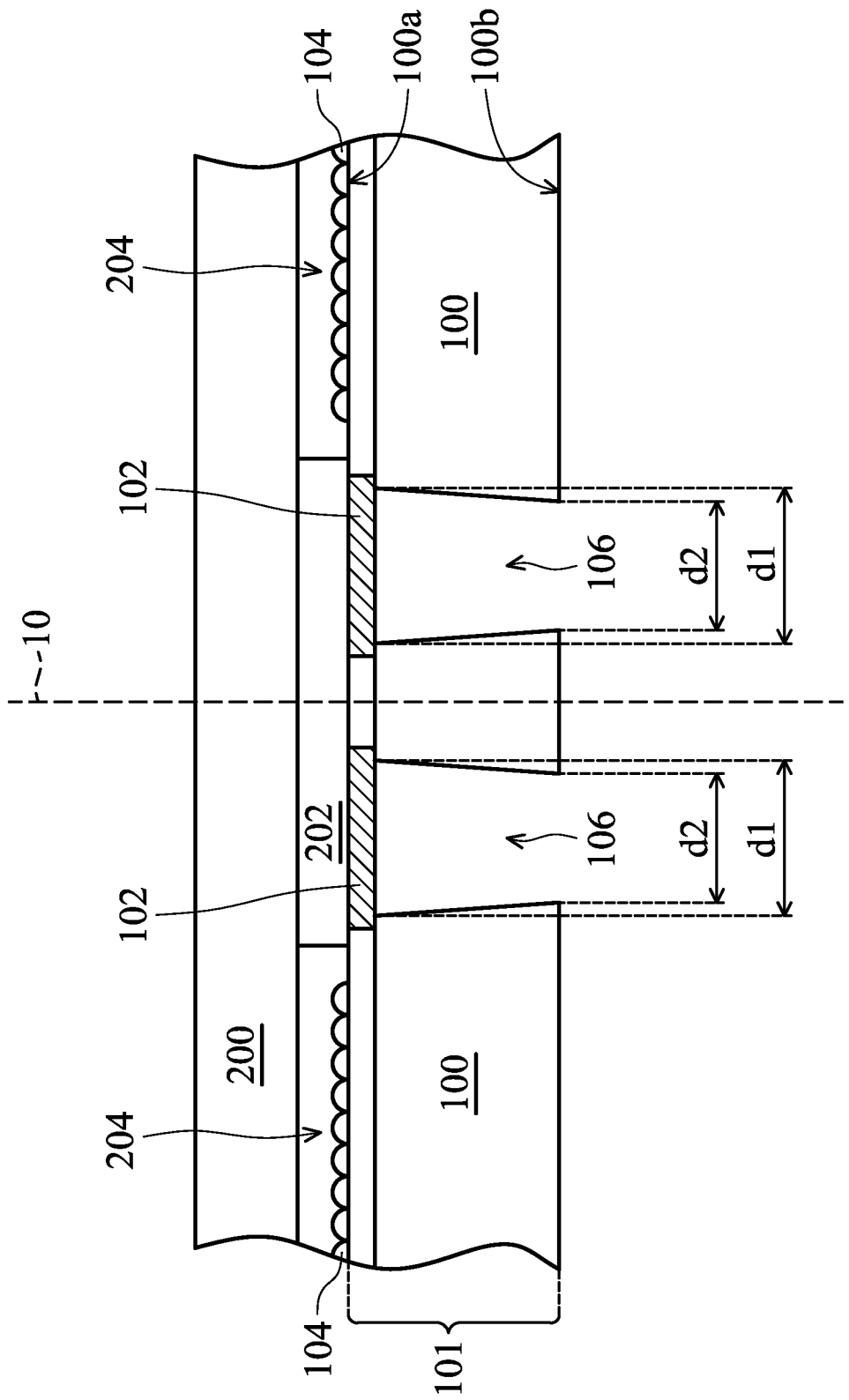
Figure 1D:
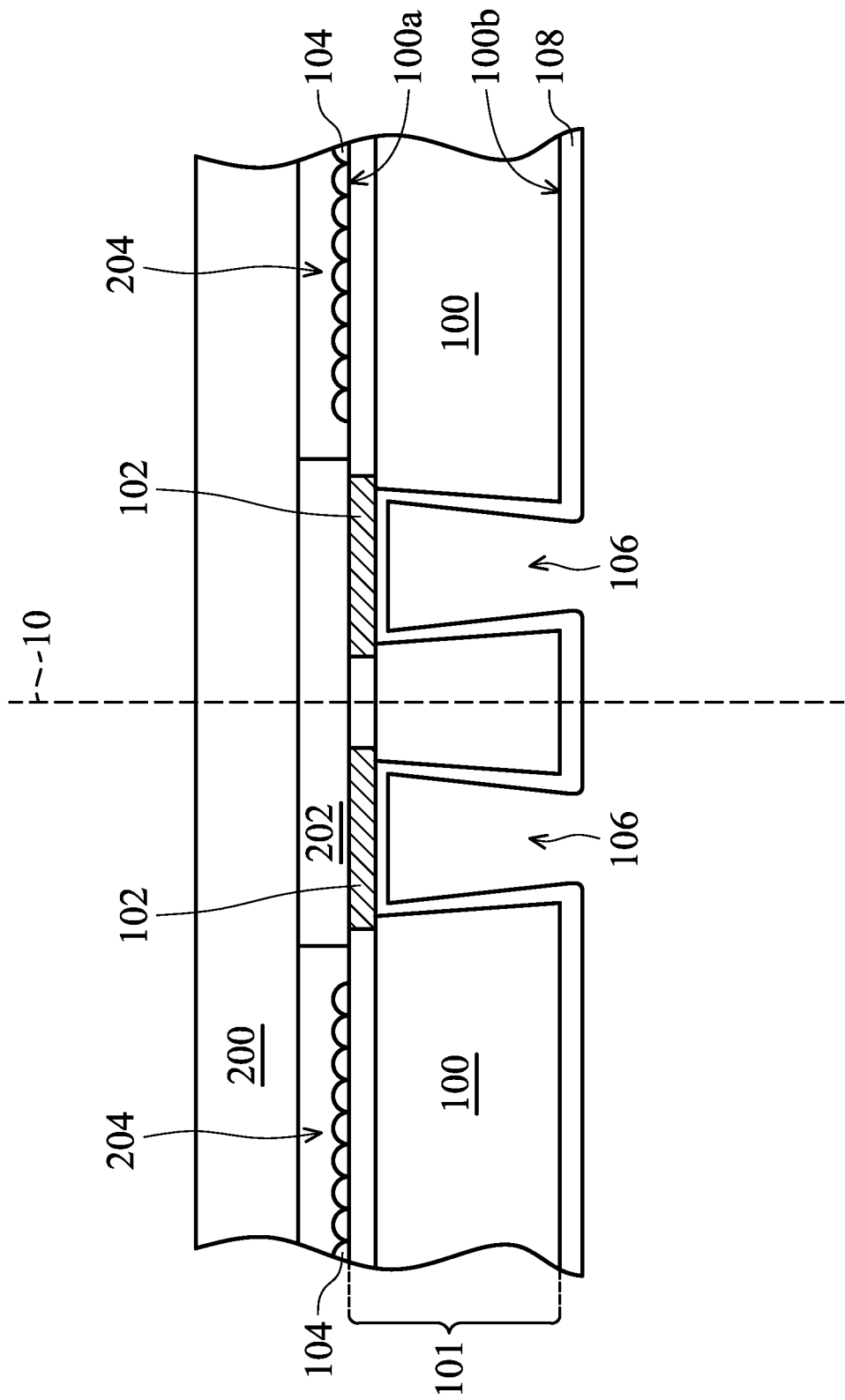
Figure 1E:
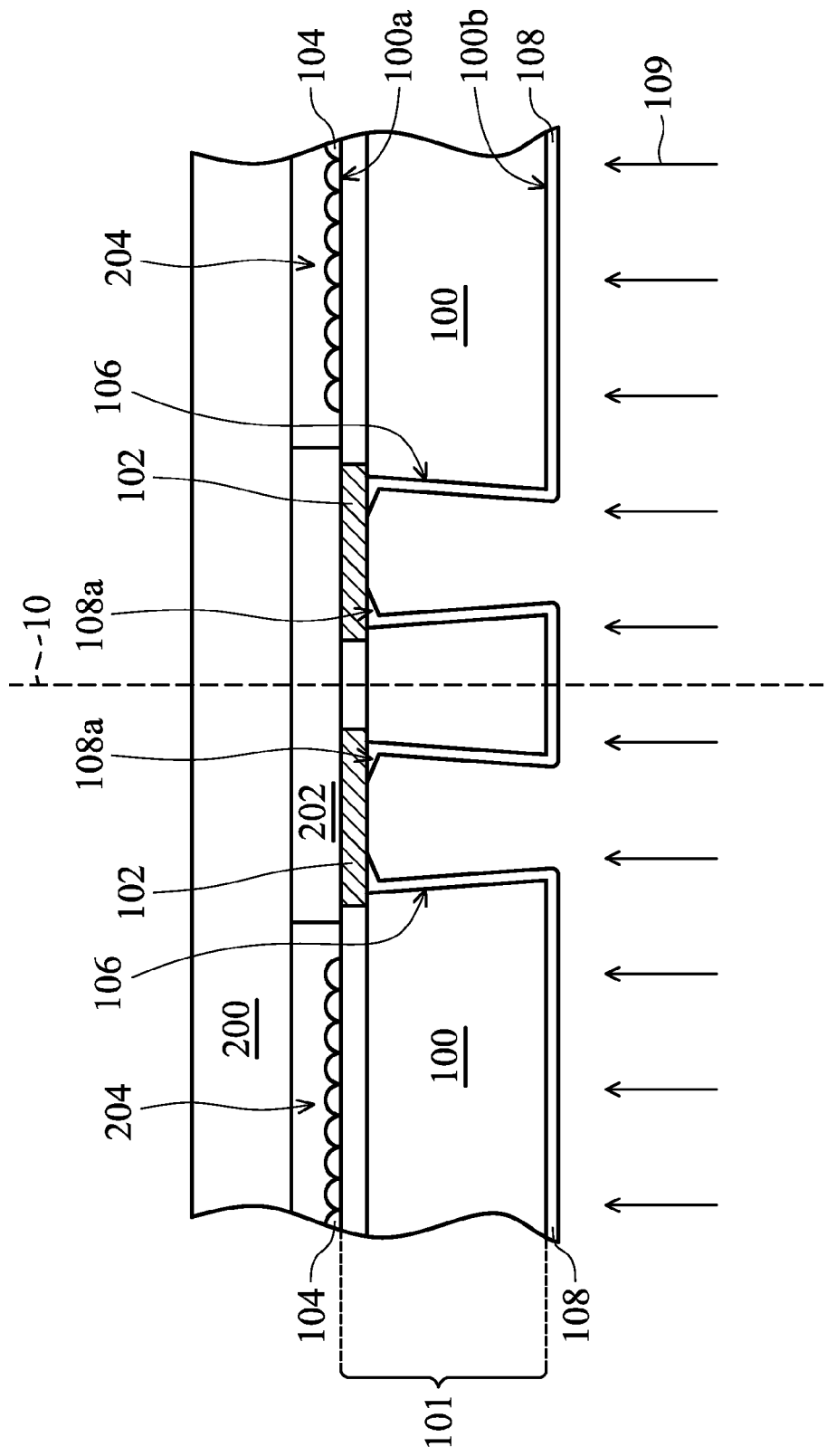
Figure 1F:
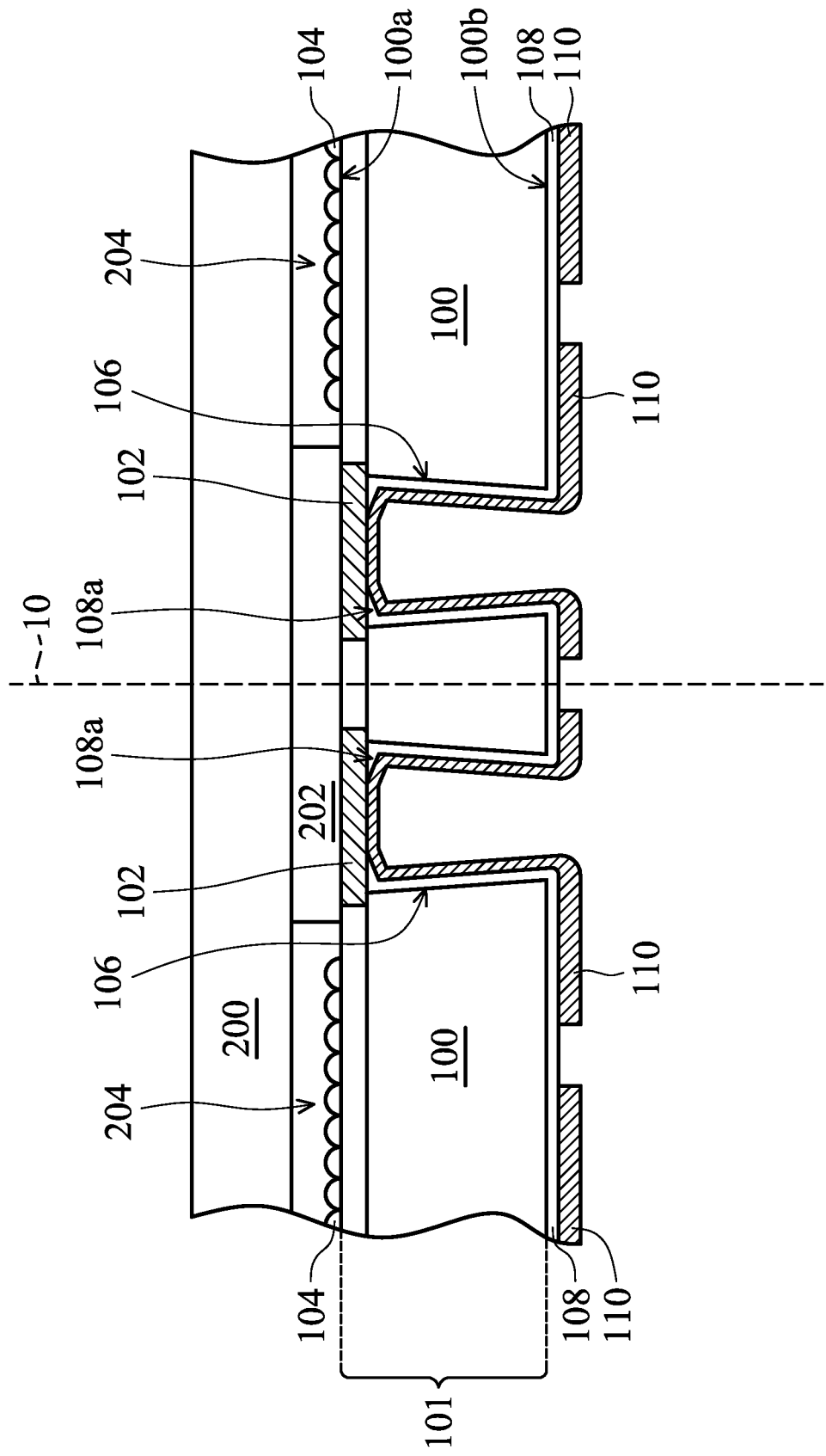
Figure 1G:
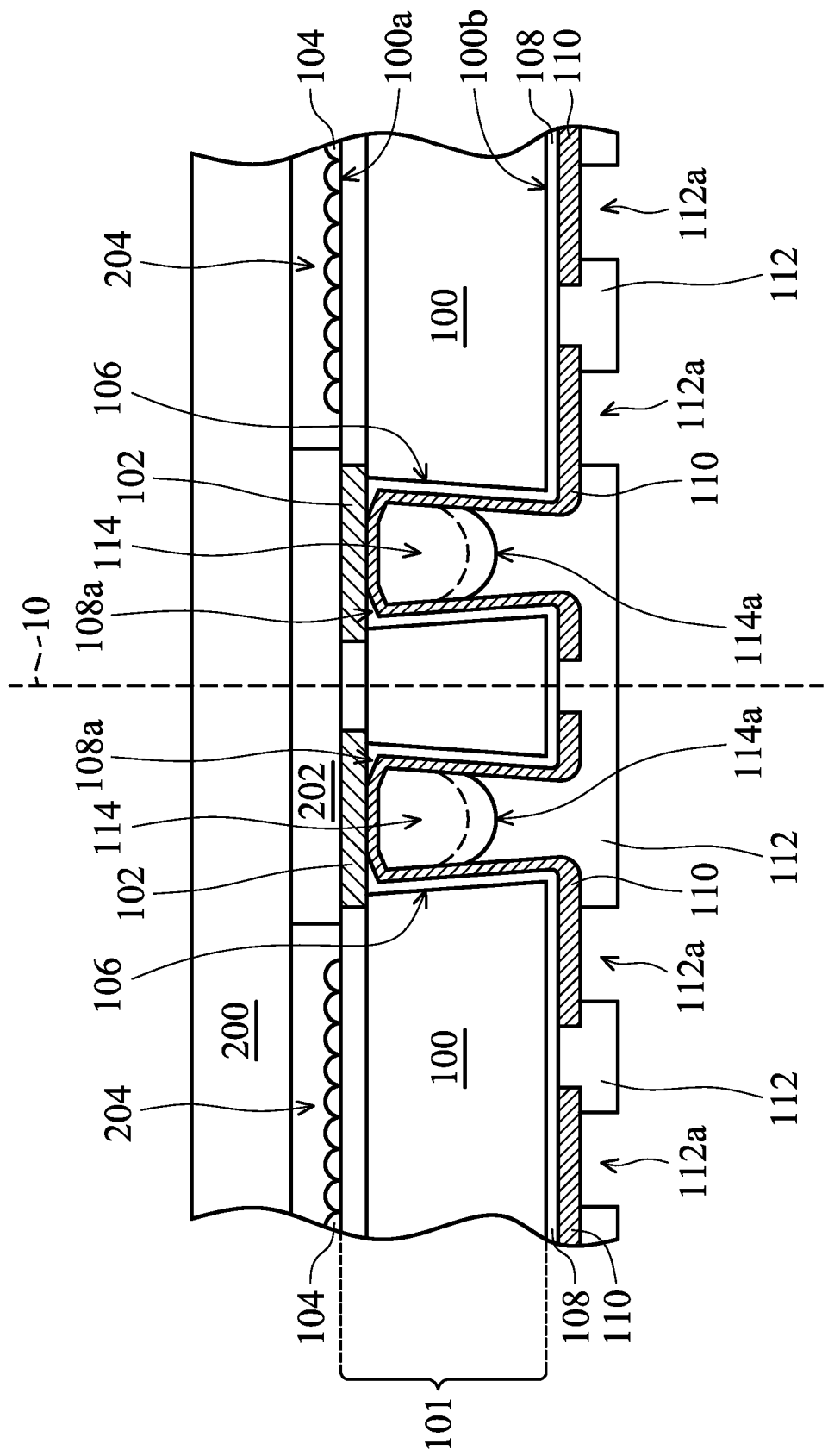
Figure 1H:
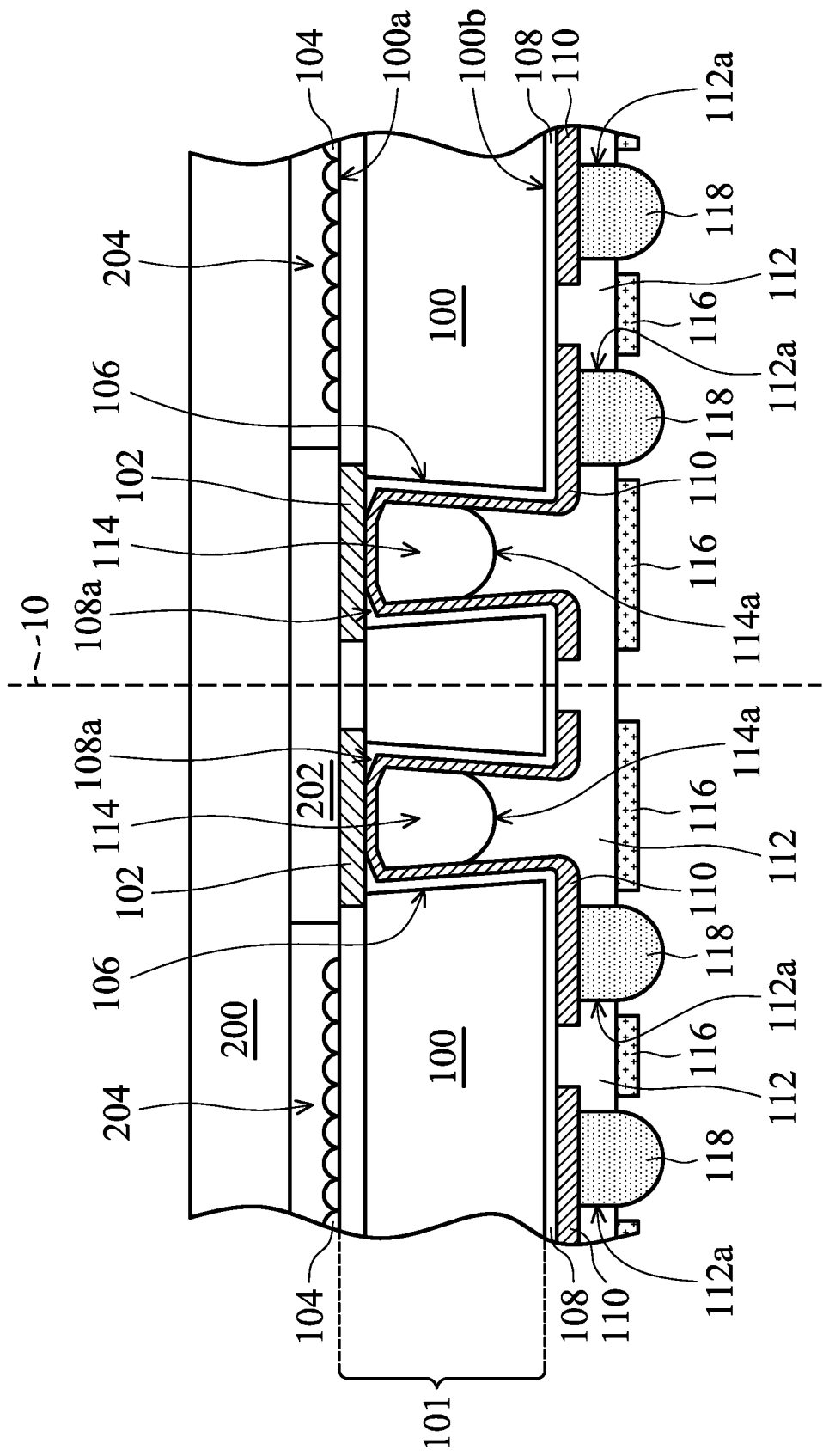
Figure 1I:
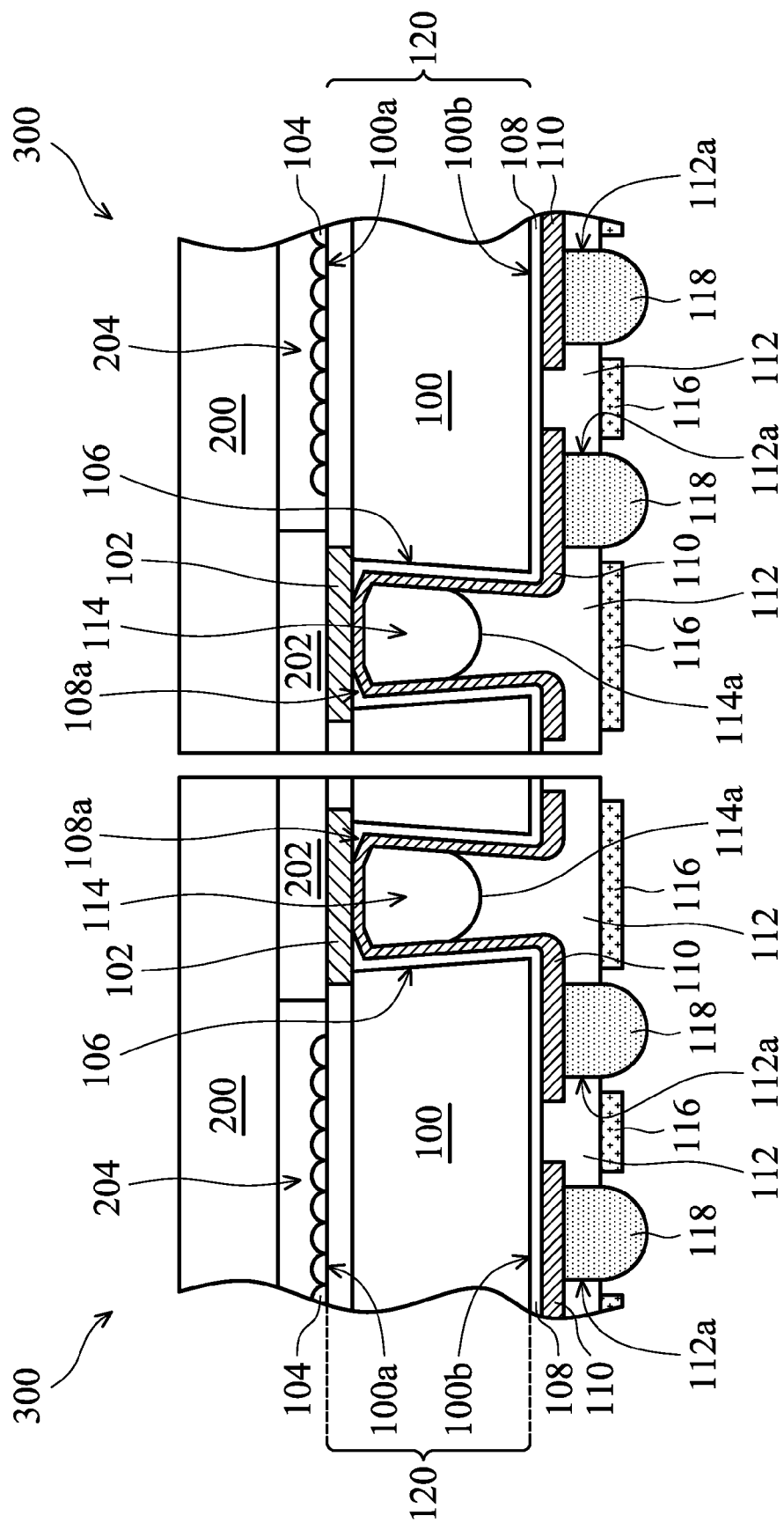

Referring to FIG. 1I, which illustrates a cross section of an exemplary embodiment of a chip package according to the invention. In the embodiment, the chip package may be applied to various electronic components including active or passive elements, digital or analog integrated circuits, such as optoelectronic devices, micro electro mechanical systems (MEMS), micro fluidic systems, and physical sensors for detecting physical characteristics such as detecting heat, light, or pressure. In particular, a wafer level package (WLP) process may be performed to package semiconductor chips which include image sensor devices, light-emitting diodes (LEDs), solar cells, RF circuits, accelerators, gyroscopes, micro actuators, surface acoustic wave devices, pressure sensors, and ink printer heads.

A WLP process involving electronic devices is first packaged at the wafer level and then diced into individual packages. However, in a specific embodiment, separate semiconductor chips may be, for example, redistributed on a carrier wafer for a subsequent packaging process, which may be called a WLP process. In addition, a stacking process may also be used in the WLP process mentioned above to stack a plurality of wafers having integrated circuits to form electronic device packages of multi-layered integrated circuit devices.

The chip package 300 comprises a semiconductor chip 120, an insulating layer 108, a redistribution layer (RDL) 110, a passivation layer 112, at least one bump 118, a microlens array 104, and a glass substrate 200. The semiconductor chip 120 has a first surface 100a and a second surface 100b opposite to the first surface 100a. In the embodiment, the semiconductor chip 120 comprises a substrate 100 and a dielectric layer thereon. The substrate 100, such as a silicon or other semiconductor substrate, may comprise conductive layers, dielectric layers, and other semiconductor elements (e.g., active or passive elements or electronic components for digital or analog integrated circuits). In order to simplify the diagram, only a flat substrate is depicted. Each semiconductor chip 120 has at least one conductive pad 102 adjacent to the first surface 100a and in the dielectric layer on the substrate 100. The conductive pad 102 is electrically connected to the circuits (not shown) in the substrate 100 for providing electrical connections between the semiconductor chip 120 and exterior circuits.

Moreover, the semiconductor chip 120 has an opening 106 (as shown in FIG. 1C) extending toward the first surface 100a from the second surface 100b to expose a corresponding conductive pad 102. In the embodiment, the opening 106 has a first caliber d1 adjacent to the first surface 100a and a second caliber d2 adjacent to the second surface 100b, and the first caliber d1 is greater than the second caliber d2, as shown in FIG. 1C.

The insulating layer 108 is disposed on the second surface 100b of the semiconductor chip 120 and extends to a sidewall and a bottom of the opening 106 to expose the conductive pad 102 on the bottom of the opening 106. In one embodiment, the insulating layer 108 on the bottom of the opening 106 has an underfoot structure 108a, as shown in FIG. 1E.

The RDL 110 is disposed on the insulating layer 108 and extends into the opening 106, such that the RDL 110 is electrically connected to the exposed conductive pad 102 through the opening 106.

The passivation layer 112 covers the RDL 110 and partially fills the opening 106 to form an avoid 114 between the passivation layer 112 and the conductive pad 102 in the opening 106. The passivation layer 112 has at least one opening 112a to expose the RDL 110 above the second surface 100b of the semiconductor chip 120. Moreover, the passivation layer 112 may comprise, but is not limited to, a solder mask material, and has a coefficient of viscosity in a range of 7000 cp to 11000 cp. In the embodiment, the avoid 114 serves as a buffer between the passivation layer 112 and the RDL 110, thereby reducing undesired stress due to the mismatch of the CTE between the passivation layer 112 and the RDL 110. Accordingly, the delamination between the RDL 110 and the conductive pad 102 can be prevented. In one embodiment, the ratio of the height of the avoid 114 to the depth of the opening 106 is in a range of ½ to ¾. Moreover, the top portion of the avoid 114 may have a rotational symmetric profile with respect to a central axis of the avoid 114. For example, the top portion of the avoid 114 may have an arched profile.

The conductive bump 118 is disposed in a corresponding opening 112a and is electrically connected to the exposed RDL 110 through the opening 112a.

A dam structure 202 is on a surface of the glass substrate 200. The glass substrate 200 is attached to the first surface 100a of the semiconductor chip 120 through the dam structure 202, to form a cavity 204 between the glass substrate 200 and the semiconductor chip 120.

The microlens array 104 is disposed on the first surface 100a of the semiconductor chip 120 and in the cavity 204.

FIGS. 1A to 1I are cross sections of an exemplary embodiment of a method for fabricating a chip package 300 according to the invention. Referring to FIG. 1A, a glass substrate 200 having a dam structure 202 thereon, is provided. Referring to FIG. 1B, a semiconductor wafer 101 having a first surface 100a and a second surface 100b opposite thereto, is provided. A microlens array 104 is formed on the first surface 100a of each chip region defined by scribe lines 10 of the semiconductor wafer 101. Next, the dam structure 202 is attached to the first surface 100a of the semiconductor wafer 101 to form a plurality of cavities 204 between the glass substrate 200 and the semiconductor wafer 101. Each cavity 204 corresponds to a chip region, such that each microlens array 104 is disposed in a corresponding cavity 204.

In the embodiment, the semiconductor wafer 101 may comprise a substrate 100 (e.g., a silicon substrate or other semiconductor substrate) and a dielectric layer thereon. The substrate 100 may comprise conductive layers, dielectric layers, and other semiconductor elements (e.g., active or passive elements or electronic components for digital or analog integrated circuits). In order to simplify the diagram, only a flat substrate is depicted. The semiconductor wafer 101 has a plurality of conductive pads 102 adjacent to the first surface 100a, in the dielectric layer on the substrate 100, and electrically connected to the circuits (not shown) in the substrate 100. The conductive pad 102 may comprise aluminum, copper, gold or a combination thereof or other pad materials well known in the art. Moreover, at least one conductive pad 102 corresponds to each chip region. In order to simplify the diagram, only a conductive pad 102 corresponding to each chip region is depicted.

Referring to FIG. 1C, a wafer thinning process is performed on the second surface 100b of the semiconductor wafer 101 (i.e., the bottom surface of the substrate 100), such that the substrate 100 is thinned to a desired thickness. The wafer thinning process typically comprises etching, milling, grinding or polishing. Thereafter, the second surface 100b of the semiconductor wafer 101 is etched to form an opening 106 extending toward the first surface 100a from the second surface 100b in each chip region, exposing a corresponding conductive pad 102. In the embodiment, the opening 106 has a first caliber d1 adjacent to the first surface 100a and a second caliber d2 adjacent to the second surface 100, wherein the first caliber d1 is greater than the second caliber d2. Accordingly, the sidewall of the opening 106 is tilted with respect to the surface of the substrate 100. The opening 106 may be any shape as viewed from a top view perspective, such as a circular, elliptic, square or rectangular shape. When the opening is circular, the calibers d1 and d2 are the diameters of the opening.

In one embodiment, the formation of the opening 106 may comprise the removal of the substrate 100 by a dry etching process. For example, a main etch is performed firstly. Next, the etching conditions (such as power, pressure, and/or concentrations of the process gases) are changed to perform an over etching process, thereby forming the openings with the first caliber d1 being greater than the second caliber d2.

Referring to FIGS. 1D to 1E, an insulating layer 108 is formed on the second surface 100b of the semiconductor wafer 101, extending to a sidewall and a bottom of each opening 106, and exposing the conductive pad 102. The insulating layer 108 is isolated from a subsequent conductive trace layer and may comprise epoxy resin, solder mask, or other suitable insulating materials, such as silicon oxide, silicon nitride, silicon oxynitride, metal oxide or a combination thereof The insulating layer 108 may be formed by a coating process (e.g., spin coating, spray coating, or curtain coating)

or other suitable deposition, such as liquid phase deposition, physical vapor deposition (PVD), chemical vapor deposition (CVD), low pressure CVD (LPCVD), plasma enhanced CVD (PECVD), rapid thermal CVD or atmospheric pressure CVD (APCVD). Since the sidewall of the opening 106 is tilted with respect to the surface of the substrate 100 and the first caliber d1 is greater than the second caliber d2, the insulating layer 108 on the bottom surface (i.e., the second surface 100b) of the substrate 100 typically has a thickness greater than that of the insulating layer 108 on the sidewall and bottom of the opening 106. Next, Referring to FIG. 1E, a self-aligned etching process 109 is performed on the insulating layer 108, such that the insulating layer 108 on the bottom of the opening 106 forms an underfoot structure 108a and exposes the conductive pad 102 in the opening 106. In one embodiment, the self-aligned etching process 109 may comprise an anisotropic etching process, such as a reactive ion etching (RIE) process.

Next, referring to FIG. 1F, an RDL layer 110 is formed on the insulating layer 108. The RDL 108 extends into each opening 106, such that the RDL 110 is electrically connected to the exposed conductive pad 102 through the opening 106, to form a TSV structure.

Referring to FIG. 1G, the RDL 110 is covered with a passivation layer 112, wherein the passivation layer 112 has a plurality of openings 112a exposing the RDL 11 0on the second surface 100b of the semiconductor wafer 101. Each chip region corresponds to at least one opening 112a. In the embodiment, the passivation layer 112 may comprise, but is not limited to a solder mask material, and has a coefficient of viscosity in a range of 7000 cp to 11000 cp. Moreover, since the sidewall of the opening 106 is tilted with respect to the surface of the substrate 100 and the first caliber d1 is greater than the second caliber d2, air remains in the opening 106, such that the passivation layer 112 on the RDL 110 partially fills each opening 106, so as to form an avoid 114 between the passivation layer 112 and the conductive pad 102 in each opening 106, wherein the passivation layer 112 in the opening 106 does not contact the conductive pad 102.

Next, a baking process is performed to the passivation layer 112 for curing thereof Since the temperature and pressure of the air in the avoid 114 are raised, the passivation layer is shrunk and thus the height of the avoid 114 is increased. In FIG. 1G, the dash line shown in the opening 106 represents the top of the avoid 114 before performing the baking process. The height of the avoid 114 must be appropriate. The passivation layer 112 cracks easily when the height of the avoid 114 is too high, and the avoid 114 cannot effectively serve as a buffer between the passivation layer 112 and the RDL 110 when the height of the avoid 114 is too low. In one embodiment, the ratio of the height of the avoid 114 to the depth of the opening 106 is in a range of ½ to ¾. Moreover, the top portion 114a of the avoid 114 has a rotational symmetric profile with respect to a central axis of the avoid 114. For example, the top portion of the avoid 114 may have an arched profile.

Next, referring to FIG. 1H, a conductive bump 118 is formed in each opening 112a, such that each conductive bump 118 is electrically connected to the RDL 110 through a corresponding opening 112a. Additionally, in one embodiment, a light shielding layer 116, such as black photoresist, may be formed prior to formation of the conductive bump 118 when the chip package is applied to an optoelectronic device, thereby preventing light leakage.

Next, referring to FIG. 1I, the semiconductor wafer 101 is cut along the scribe lines 10 (as shown in FIG. 1H) to form a semiconductor chip 120 corresponding to each chip region.

Next, the dam structure 202 and the glass substrate 200 are cut along the scribe lines 10 to form a plurality of individual chip packages 300.

According to the aforementioned embodiments, since the avoid in the TSV structure can serve as a buffer between the passivation layer and the RDL, the delamination between the RDL and the conductive pad of the semiconductor chip can be prevented, thereby increasing the reliability of the chip package.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor chip, having a first surface and a second surface opposite thereto, at least one conductive pad adjacent to the first surface, and a first opening extending toward the first surface from the second surface to expose the conductive pad, wherein the first opening has a first caliber adjacent to the first surface and a second caliber adjacent to the second surface, and the first caliber is different with the second caliber;
   an insulating layer disposed on the second surface, and extending to a sidewall and a bottom of the first opening, and exposing the conductive pad;
   a redistribution layer disposed on the insulating layer and electrically connected to the exposed conductive pad through the first opening; and
   a passivation layer covering the redistribution layer and partially filling the first opening to form a void between the passivation layer and the conductive pad in the first opening, wherein the passivation layer has at least one second opening exposing the redistribution layer above the second surface.

2. The chip package of claim 1, wherein the ratio of the height of the void to the depth of the first opening is in a range of ½ to ¾.

3. The chip package of claim 1, wherein the passivation layer in the first opening does not contact the conductive pad.

4. The chip package of claim 1, wherein the top portion of the void has an arched profile.

5. The chip package of claim 1, wherein the top portion of the void has a rotational symmetric profile with respect to a central axis of the void.

6. The chip package of claim 1, wherein the insulating layer on the bottom of the first opening has an underfoot structure.

7. The chip package of claim 1, wherein the passivation layer has a coefficient of viscosity in a range of 7000 cp to 11000 cp.

8. The chip package of claim 1, wherein the passivation layer comprises a solder mask material.

9. The chip package of claim 1, further comprising:
   a glass substrate having a dam structure thereon and attached to the first surface of the semiconductor chip, to form a cavity between the glass substrate and the semiconductor chip; and
   a microlens array disposed on the first surface of the semiconductor chip and located in the cavity.

10. The chip package of claim 1, further comprising a conductive structure disposed in the second opening and electrically connected to the redistribution layer through the second opening.

11. The chip package of claim 10, wherein the conductive structure is a conductive bump.

12. A method for fabricating a chip package, comprising:
providing a semiconductor wafer having a first surface and a second surface opposite thereto and having at least one conductive pad adjacent to the first surface and corresponding to each chip region;
etching the semiconductor wafer to form a first opening extending toward the first surface from the second surface in each chip region to expose the conductive pad, wherein the first opening has a first caliber adjacent to the first surface and a second caliber adjacent to the second surface, and the first caliber is different with the second caliber;
forming an insulating layer on the second surface, and extending to a sidewall and a bottom of each first opening and exposing the conductive pad;
forming a redistribution layer on the insulating layer, wherein the redistribution layer is electrically connected to the exposed conductive pad through each first opening;
forming a passivation layer covering the redistribution layer and partially filling each first opening to form a void between the passivation layer and the conductive pad in each first opening, wherein the passivation layer has at least one second opening exposing the redistribution layer above the second surface; and
cutting the semiconductor wafer to form a semiconductor chip corresponding to each chip region.

13. The method of claim 12, wherein the step of forming the insulating layer further comprises a step of performing a self-aligned etching process to expose the conductive pad.

14. The method of claim 13, wherein the insulating layer on the bottom of the first opening has an underfoot structure.

15. The method of claim 13, wherein the step of cutting the semiconductor wafer further comprises a step of performing a thinning process on the second surface of the semiconductor wafer.

16. The method of claim 15, wherein the ratio of the height of the void to the depth of the first opening is in a range of ½ to ¾.

17. The method of claim 12, wherein the passivation layer in the first opening does not contact the conductive pad.

18. The method of claim 12, wherein the top portion of the void has an arched profile.

19. The method of claim 12, wherein the top portion of the void has a rotational symmetric profile with respect to a central axis of the void.

20. The method of claim 12, wherein the passivation layer has a coefficient of viscosity in a range of 7000 cp to 11000 cp.

21. The method of claim 12, wherein the passivation layer comprises a solder mask material.

22. The method of claim 12, further comprising:
forming a microlens array on the first surface of each chip region;
providing a glass substrate having a dam structure thereon;
attaching the dam structure to the first surface of the semiconductor wafer to form a cavity between the glass substrate and the semiconductor wafer and corresponding to each chip region, such that each microlens array is located in a corresponding cavity; and
cutting the dam structure and the glass substrate.

23. The method of claim 12, further comprising forming a conductive structure in the second opening before cutting the semiconductor wafer, wherein the conductive structure is electrically connected to the redistribution layer through the second opening.

24. The method of claim 23, wherein the conductive structure is a conductive bump.

* * * * *